(12) United States Patent
Ahn (10) Patent No.: US 11,355,369 B2
(45) Date of Patent: Jun. 7, 2022

(54) METHOD OF MONITORING SURFACE TEMPERATURES OF WAFERS IN REAL TIME IN SEMICONDUCTOR WAFER CLEANING APPARATUS AND TEMPERATURE SENSOR FOR MEASURING SURFACE TEMPERATURES OF WAFER

(71) Applicants: Jongpal Ahn, Yongin-si (KR); AJ TECH CO., LTD., Yongin-si (KR)

(72) Inventor: Jongpal Ahn, Yongin-si (KR)

(73) Assignees: Jongpal Ahn, Yongin-si (KR); AJ TECH CO., LTD., Yongin-si (KR)

( * ) Notice: Subject to any disclaimer, the term of this patent is extended or adjusted under 35 U.S.C. 154(b) by 507 days.

(21) Appl. No.: 16/593,221

(22) Filed: Oct. 4, 2019

(65) Prior Publication Data

US 2020/0118848 A1 Apr. 16, 2020

(30) Foreign Application Priority Data

Oct. 15, 2018 (KR) .......................... 10-2018-0122350
Apr. 1, 2019 (KR) .......................... 10-2019-0037663

(51) Int. Cl.
| | | |
|---|---|---|
| *H01L 21/67* | (2006.01) | |
| *G01J 5/04* | (2006.01) | |
| *B08B 3/08* | (2006.01) | |
| *G01J 5/00* | (2022.01) | |

(52) U.S. Cl.
CPC .......... *H01L 21/67248* (2013.01); *B08B 3/08* (2013.01); *G01J 5/045* (2013.01); *H01L 21/67051* (2013.01); *G01J 2005/0077* (2013.01)

(58) Field of Classification Search
CPC ................................................ H01L 21/67248
See application file for complete search history.

(56) References Cited

FOREIGN PATENT DOCUMENTS

| JP | H08-075554 A | 3/1996 |
|---|---|---|
| JP | 2004-522310 A | 7/2004 |
| JP | 2008-225104 A | 9/2008 |
| KR | 10-1999-0073317 A | 10/1999 |
| KR | 10-2015-0116736 A | 10/2015 |
| KR | 10-2018-0121437 A | 11/2018 |

*Primary Examiner* — Jason Y Ko
(74) *Attorney, Agent, or Firm* — KORUS Patent, LLC; Seong Il Jeong (57) ABSTRACT

A method of monitoring the surface temperatures of wafers in real time by measuring them according to the present invention monitors the surface temperatures of a polishing pad in real time by measuring them, and can thus actively deal with irregular variations in temperature on the surface of the wafer attributable to chemical reaction and friction in the process of cleaning the wafer. A sensor for measuring the surface temperatures of a wafer according to the present invention can be used in an environment in which there is fume generated from a cleaning solution, and is responsible for temperatures at respective points of an infrared camera and allows the correction of temperatures in respective sections.

4 Claims, 10 Drawing Sheets

METHOD OF MONITORING SURFACE TEMPERATURES OF WAFERS IN REAL TIME IN SEMICONDUCTOR WAFER CLEANING APPARATUS AND TEMPERATURE SENSOR FOR MEASURING SURFACE TEMPERATURES OF WAFER

CROSS-REFERENCE TO RELATED APPLICATION

This application claims the benefit of Korean Patent Application Nos. 10-2018-0122350 and 10-2019-0037663 filed on Oct. 15, 2018 and Apr. 1, 2019, respectively, which are hereby incorporated by reference herein in their entirety.

BACKGROUND

1. Technical Field

The present invention relates generally to a method of monitoring the surface temperatures of wafers in a semiconductor wafer cleaning apparatus, and more specifically to a method of monitoring the surface temperatures of wafers in real time by measuring them in the process of cleaning the wafers with a semiconductor wafer cleaning apparatus.

Furthermore, the present invention relates generally to an infrared temperature sensor for measuring the surface temperatures of a wafer, and more specifically to an infrared temperature sensor for measuring the surface temperatures of a wafer, which is installed inside each chamber of a semiconductor wafer cleaning apparatus and measures the surface temperatures of a wafer, which is configured to have a chemical resistance property and a waterproofing property, which can be used in an environment in which there is fume generated from a cleaning solution, and which is responsible for temperatures at respective points of an infrared camera and enables the correction of temperatures in respective sections because the incident angle of infrared rays can be maintained at 90 degrees.

2. Description of the Related Art

Generally, as the degree of integration of semiconductor devices fabricated on semiconductor wafers has increased, a multilayer wiring process has been performed. Accordingly, the differences in the height of interlayer insulating films between multi-layer wirings increase, and thus the planarization work becomes more important. Moreover, as a manufacturing technology for planarizing a surface of a wafer, chemical mechanical polishing (CMP) is a technology for mechanically planarizing the uneven portions of the surface of a wafer by moving a platen and a polishing head relative to each other while chemically reacting the surface of the wafer by supplying a slurry in a state of maintaining the wafer in contact with the surface of a polishing pad.

Conventionally, in the process of removing metal and organic contaminants from a surface of a semiconductor wafer using CMP equipment, when the surface of a wafer reaches a certain temperature or higher due to a chemical reaction and friction, a problem arises in that yield is significantly reduced due to defects of wafers.

Furthermore, technologies for cleaning a surface of a wafer in a semiconductor wafer cleaning apparatus are basically divided into wet cleaning and dry cleaning. Although a cleaning process is considerably similar to an etching process in that they remove material on a surface of a semiconductor wafer, they are different in that the cleaning process is intended to remove impurities on a surface of a wafer. The impurities include films, individual particles or agglomerates of particles, adsorbed gases, etc., which have material properties such as those of atoms, ions, molecules, and the like. Although conventional silicon wafer cleaning methods were mostly chemical wet cleaning using hydrogen peroxide ($H_2O_2$) solutions, cleaning technology has been gradually changed from chemical wet cleaning to dry cleaning due to the excessive consumption of chemicals, the disposal of used materials, and incompatibility with other manufacturing processes. First, the wet cleaning of a silicon wafer will be described. The technology used for the longest period is RCA cleaning, which is the most common method used for wet chemical cleaning. Solutions used for RCA cleaning include high-purity deionized (DI) water, hydrogen peroxide ($H_2O_2$), ammonium hydroxide ($NH_4OH$), and hydrochloric acid (HCl). This method usually consists of two steps: RCA Standard Clean 1 (SC-1) and RCA Standard Clean 2 (SC-2). At the first step, surface organic materials are oxidized and dissolved due to strong oxidation, and residual metallic impurities (Au, Ag, Cu, Ni, Cd, Zn, Co, Cr, etc.) are also removed. At the second step, hydroxides, i.e., $Al(OH)_3$, $Fe(OH)_3$, $Mg(OH)_2$, and $Zn(OH)_2$, which are insoluble in alkali ions ($Al3+$, $Fe3+$, and $Mg2+$) and $NH_4OH$, and remaining materials which have not been removed until then are removed. In some cases, a dilute hydrofluoric acid (HF) solution may be used to effectively remove the hydroxides produced after the first step. In this case, changes in the temperature of a cleaning solution produce various important effects. That is, as the temperature increases, the reaction rate of chemicals also increases. Accordingly, as the temperature rises by about 10° C., the reaction rate will be doubled. In addition, an increase in the temperature generally increases the solubility of contaminants, thus making cleaning faster. Furthermore, an increase in the temperature may cause the plating of metal composites on a surface of a wafer. In addition, a cleaning action occurs only when the cleaning solution is well adsorbed on a surface of a wafer. Therefore, the adhesion state of the cleaning solution onto a surface of a wafer is also an important factor to be considered for the improvement of a cleaning effect. When the surface tension of a wafer, which is a solid, is similar to that of a cleaning solution, which is a liquid or the surface tension of the solid is higher than that of the liquid, the adhesion of the liquid onto a surface of the solid occurs well. In general, many organic solvents have lower surface tension than inorganic solutions, and thus adhere well onto wafers. Depending on whether a surface to be cleaned is hydrophilic or hydrophobic, the choice of solvent and additives must vary.

Meanwhile, drying a wafer is the last important step of a cleaning process of successfully removing contaminants. Water must be forcibly removed out of a wafer before it can evaporate while leaving impurities on a surface of the wafer. Commonly used drying methods include centrifugation, steam drying, and hot-DI water drying.

Although wet cleaning has been commonly used for processes of manufacturing integrated circuits method, it has many problems in that incompatibility between processes occurs in the process integration between a wafer cleaning process and other integrated circuit manufacturing processes, the aspect ratios of wafer surface models to be cleaned are increased, it is difficult to remove impurities from chemical solutions, high-purity chemical materials and DI-water are expensive, and used wastes need to be processed. In order to overcome these problems, dry wafer cleaning technologies have been rapidly developed. In dry cleaning, contaminants are removed by predetermined steps. In addition, there is steam cleaning. Unlike dry cleaning in which cleaning is performed by a surface chemical reaction or a physical method promoted by plasma, ion bombardment, electrons, or photons, steam cleaning separates contaminants by evaporating a cleaning solution and bringing generated vapor into contact with a surface of a substrate. Steam cleaning has many of the general advantages of dry cleaning than wet cleaning, and thus steam cleaning is advantageous in that contamination attributable to the remaining of a cleaning solution itself can be prevented, accurate control can be performed, waste can be easily processed, stability can be improved by computer control, the various types of steam and various changes in temperature and pressure of steam can be handled, and an in-situ process can be easily implemented. As a result, steam cleaning is a technology which has been widely adopted in recent years.

As an art related to the present invention, Korean Patent Application Publication No. 10-2016-0138194 discloses a method of measuring the temperature of semiconductor workpiece using an infrared rays, the method further including a step of processing a workpiece after a recording step, the processing step including: a step of locating the workpiece on a heated platen; a step of waiting for a predetermined period of time; and a step of processing the workpiece after the waiting step; wherein the predetermined period of time is determined based on a recorded time it takes for the workpiece to reach the predetermined temperature.

Meanwhile, in the conventional semiconductor wafer cleaning apparatus, a temperature sensor is provided in an apparatus for the installation and location adjustment of a temperature sensor for measuring the surface temperatures of a wafer. The conventional temperature sensor does not have a waterproofing function and a chemical resistance property, and thus fume generated from a cleaning solution is condensed on the temperature sensor because the conventional temperature sensor is installed inside a chamber and exposed to the fume for a long period of time, with the result that the conventional temperature sensor cannot maintain temperature reproducibility, thereby causing the disadvantage of making it difficult to use the conventional temperature sensor inside a chamber for a long period of time.

SUMMARY

The present invention has been conceived to overcome the above-described problems, and an object of the present invention is to make it possible to monitor the surface temperatures of a wafer in real time by measuring them in the process of cleaning the wafer with a semiconductor wafer cleaning apparatus, thereby actively dealing with irregular variations in temperature on the surface of the wafer attributable to chemical reaction and friction in the process of cleaning the wafer.

Another object of the present invention is to make it possible to monitor the surface temperatures of a polishing pad in real time by measuring them in the process of polishing the wafer, thereby actively dealing with irregular variations in temperature on the surface of the wafer attributable to chemical reaction and friction in the process of polishing the wafer.

Another object of the present invention is to provide an infrared temperature sensor for measuring the surface temperatures of a wafer, which is installed inside each chamber of a semiconductor wafer cleaning apparatus and measures the surface temperatures of a wafer, which is configured to have a chemical resistance property and a waterproofing property, which can be used in an environment in which there is fume generated from a cleaning solution, and which is responsible for temperatures at respective points of an infrared camera and enables the correction of temperatures in respective sections because the incident angle of infrared rays can be maintained at 90 degrees.

In order to accomplish the above objects, the present invention provides a method of monitoring surface temperatures of wafers in real time in a semiconductor wafer cleaning apparatus, the method including: (a) cleaning surfaces of wafers inside multi-station processing chambers (MPCs) of a semiconductor wafer cleaning apparatus; (b) detecting, by temperature sensors installed in the respective MPCs, surface temperatures of the wafers; (c) amplifying, by amplifiers, signals of the surface temperatures of the wafers detected by the temperature sensors into a predetermined level, and outputting, by the amplifiers, the amplified signals; (d) receiving, by a controller, the signals of the respective amplifiers, dividing, by a wafer surface monitoring system installed on the controller in an application form, a surface of a corresponding one of the wafers into a plurality of channels for each of the MPCs, and converting, by the wafer surface monitoring system, the signals into temperature data; (e) performing, by the wafer surface monitoring system, simulation processing on the obtained temperature data, displaying, by the wafer surface monitoring system, the obtained temperature data in a graphical user interface (GUI) graph via the monitor, classifying, by the wafer surface monitoring system, the obtained temperature data for all MPCs, each of the MPCs, each history view, or each recording view, and entirely or selectively displaying, by the wafer surface monitoring system, the obtained temperature data; and (f) storing, by the wafer surface monitoring system, the temperature data obtained in the controller, comparing and analyzing, by the wafer surface monitoring system, the temperature data, and reporting and printing, by the wafer surface monitoring system, the temperature data.

The method may further include (g) issuing, by the controller, an alarm via the monitor when determining that a surface temperature of a wafer detected in one of the MPCs is equal to or higher than a set temperature.

The method may further include (h) transmitting, by the controller, temperature data for the individual MPCs to a fault detection and classification (FDC) unit over a communication network.

Furthermore, in the present invention, the wafer surface monitoring system of the controller may classify the temperature data for all the MPCs, for each of the MPCs, each history view, or each recording view, and may entirely or selectively display the temperature data.

Furthermore, in the present invention, the temperature sensors may include infrared (IR) cameras.

Furthermore, in the present invention, the wafer surface monitoring system may separate the surface temperatures of each of the wafers into 64 channels, and may display the surface temperatures via the monitor through a graphic cal user interface (GUI).

In order to accomplish the above objects, the present invention provides an infrared temperature sensor for measuring surface temperatures of a wafer, the infrared temperature sensor including: a back-end cover member in one side of which a guide hole is formed and provided to guide a cable disposed to transmit and receive measured temperature information data to and from a controller through a cable guide member so that the infrared temperature sensor can be installed inside each of the MPCs of a semiconductor wafer cleaning apparatus and measure surface temperatures of a wafer; a temperature sensor part which is fastened to a remaining surface of the back-end cover member, one surface of which is formed to be connectable to the cable and a remaining surface of which is provided with an infrared camera, and in which the infrared camera is configured to detect temperatures for respective points of the wafer; an intermediate cover member which is provided such that one end thereof can be fastened in a waterproofing manner with an intermediate cover sealing member interposed therebetween by accommodating the temperature sensor part therein; a window member which is located in front of the infrared camera of the temperature sensor part by being seated at a remaining end of the intermediate cover member in a sealable manner and surfaces of which are coated with diamond-like carbon (DLC) so that they have chemical resistance and abrasion resistance; and a front end cover member which fastens the window member with a part of the window member exposed by being fastened to a remaining end of the intermediate cover member, and which is provided to prevent the entry of water; wherein the back-end cover member is provided such that a fastening protrusion protrudes from one surface thereof in order to be fixedly connected to one end of a fastening member a remaining end of which is fastened to a multi-station processing chamber (MPC), a guide hole is formed in one side of the fastening protrusion in order to fixedly install the cable guide member provided to guide the cable which is connected to the temperature sensor part, and fastening holes are formed in respective corners of the back-end cover member in order to fasten the temperature sensor part via a plurality of fastening screws; and wherein the fastening member comprises a fastening bar configured such that one end thereof is fastened to an inner surface of the MPC and a connecting bar configured such that one end thereof is connected to the fastening bar so that an angle thereof is adjustable.

The temperature sensor part may include: a PCB in corners of which PCB fastening holes are formed such that the PCB can be fastened to a remaining surface of the back-end cover member via the plurality of fastening screws, and one side of one surface of which a cable connection portion is formed in order to connect the cable; and the infrared camera which is fixedly disposed and provided on a remaining surface of the PCB. The temperature sensor part may be coated with epoxy in order to prevent the entry of water.

The intermediate cover member may be provided such that it is formed as a hollow tube so that it can be fastened to the back-end cover member via the plurality of fastening screws by accommodating the temperature sensor part therein with the intermediate cover sealing member interposed therebetween in a waterproofing manner, a fastening screw hole is formed at a corner portion of an inner surface of the intermediate cover member, a plurality of fastening holes is formed in one side of the fastening screw hole in a radial direction so that the intermediate cover member can be fastened to one surface of the front end cover member via the plurality of screws with a front end cover sealing member interposed therebetween, and a plurality of stepped portions is formed and provided at a remaining end of the intermediate cover member so that the window member can be seated on the intermediate cover member with O-rings for sealing interposed therebetween.

BRIEF DESCRIPTION OF THE DRAWINGS

The above and other objects, features, and advantages of the present invention will be more clearly understood from the following detailed description taken in conjunction with the accompanying drawings, in which:

FIGS. 3A-3D show the results of the performance of a method of monitoring the surface temperatures of wafers in real time in a semiconductor wafer cleaning apparatus according to the present invention, wherein

DETAILED DESCRIPTION

An embodiment of a system for monitoring the surface temperatures of wafers in real time in a semiconductor wafer cleaning apparatus according to the present invention will be described in detail below with reference to the accompanying drawings.

Figure 1:
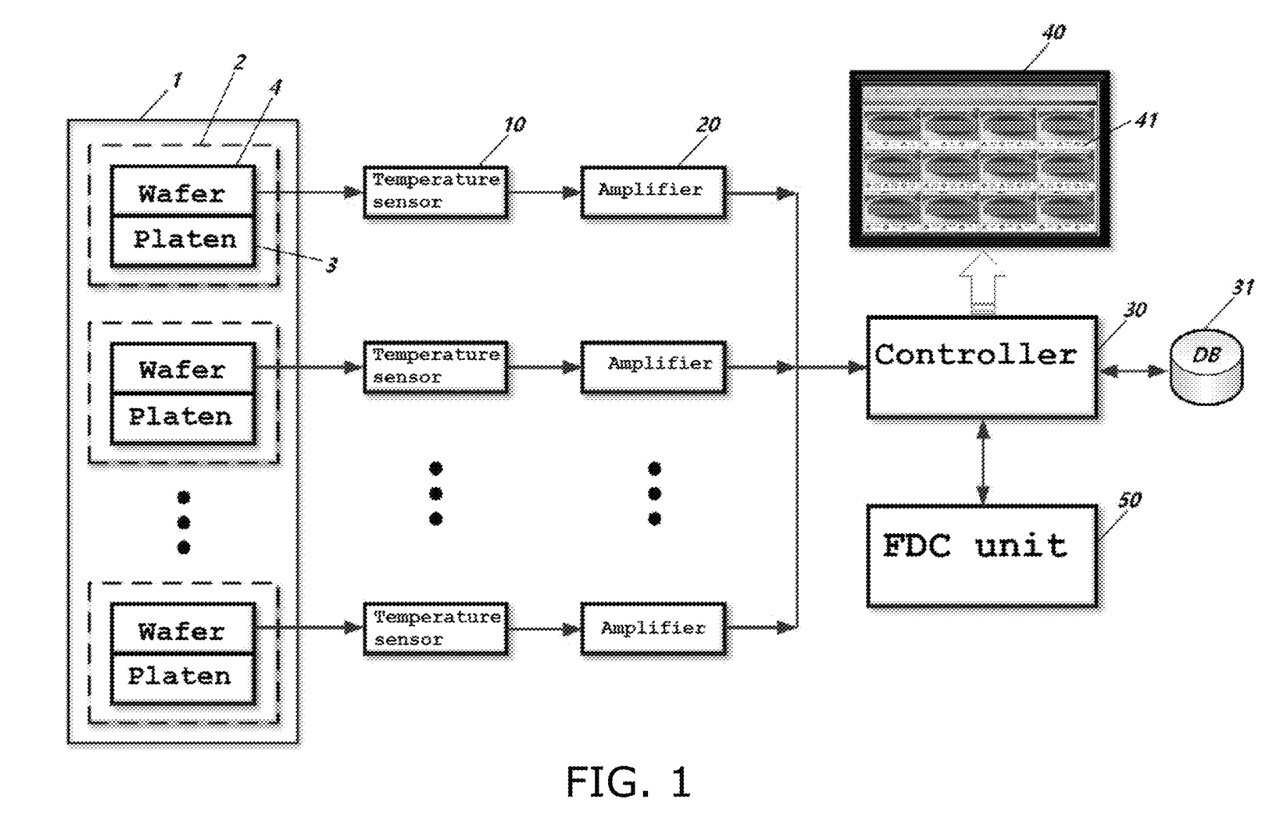
FIG. 1 is a diagram showing the configuration of a system for monitoring the surface temperatures of wafers in real time in a semiconductor wafer cleaning apparatus according to an embodiment of the present invention.
Figure 2:
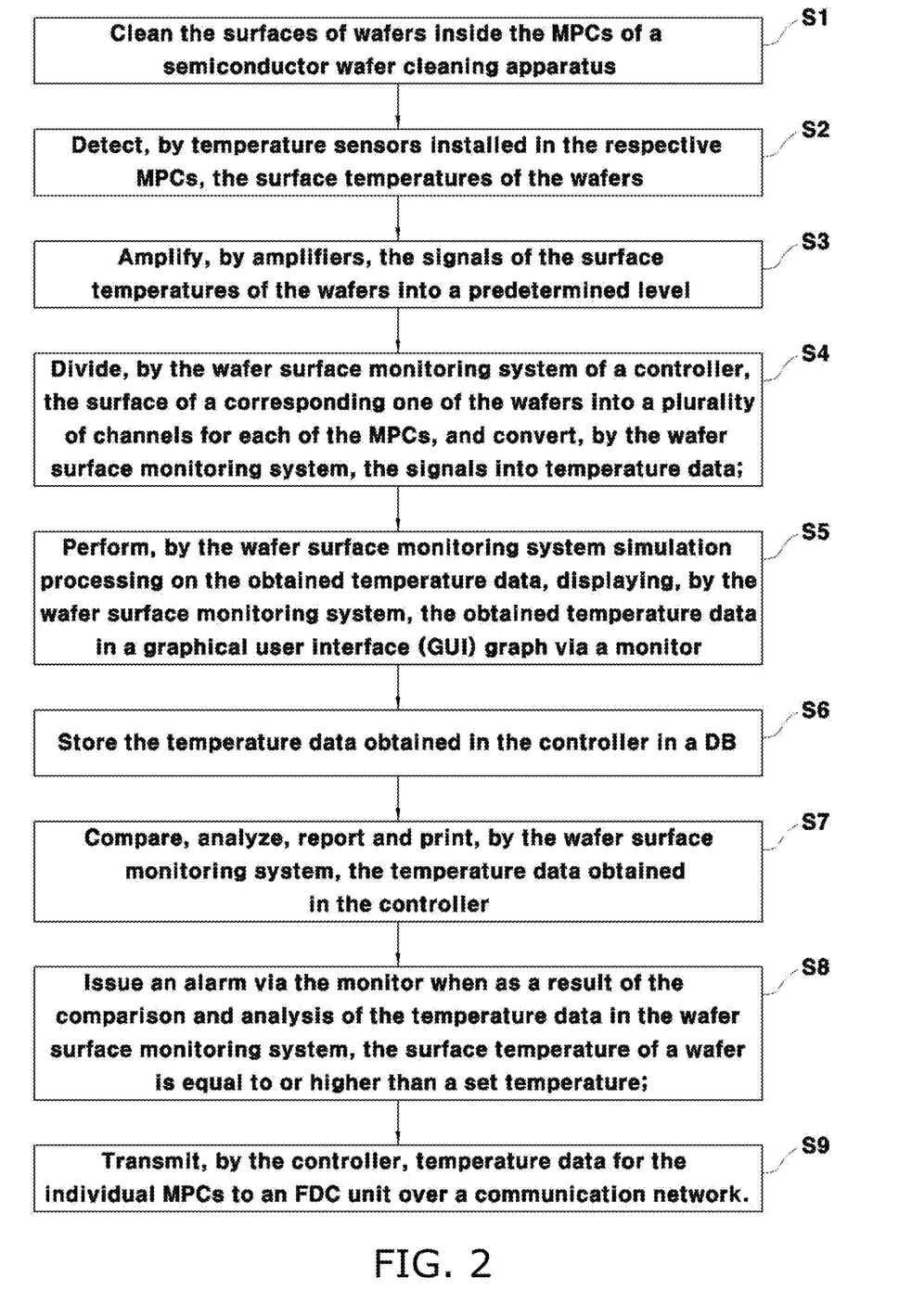
FIG. 2 is a flowchart showing a method of monitoring the surface temperatures of wafers in real time in a semiconductor wafer cleaning apparatus according to an embodiment of the present invention.

As shown in FIG. 1, temperature sensors 10 are installed inside respective multi-station processing chambers (MPCs) 2 installed in a semiconductor wafer cleaning apparatus 1. The temperature sensors 10 are non-contact sensors, and infrared cameras may be applied as the temperature sensors 10. However, the temperature sensors 10 are not limited thereto, but any conventional temperature sensors may be used as the temperature sensors 10. Furthermore, each of the temperature sensors 10 detects temperatures in multiple areas, and detects temperatures in 64 areas (64 CHs) into which the surface of a wafer is divided. The temperature sensor 10 is installed on one side of the upper portion of a corresponding one of the MPCs 2, and detects the surface temperatures of a wafer 4 inserted into a corresponding platen 3. The temperature sensor 10 has an operating range of about −30 to 120 degrees and a temperature measurement range of about −70 to 380 degrees. Furthermore, as shown in FIG. 2, the temperature sensor 10 has a measurement distance range of about 50 to 600 mm and a measurement angle range of about 40 to 60 degrees. The installation angle between the wafer, which is a detection target, and the temperature sensor 10 ranges from about 60 to 120 degrees. Furthermore, the temperature sensor 10 may communicate over an Ethernet, or may communicate in a USB or wireless manner.

A corresponding amplifier 20 receives a signal detected by the temperature sensor 10, amplifies the received signal to a predetermined level or higher, and outputs the amplified signal. The amplifier 20 may filter out noise included in a signal detected by the temperature sensor 10.

A controller 30 visually displays the temperature signal, amplified to the predetermined level or higher by the amplifier 20, via a monitor 40. Additionally, a wafer surface monitoring system 41 installed on the controller 30 is an application including a graphical user interface (GUI).

Figure 3A:
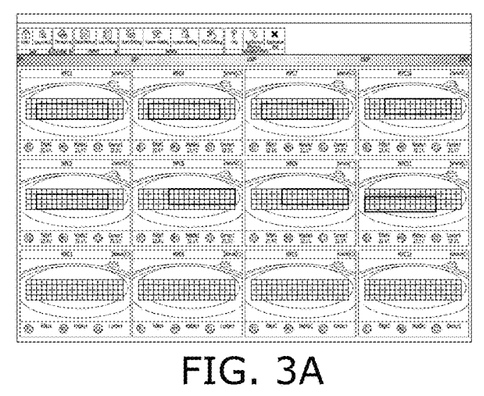
FIG. 3A shows all the surface temperatures of the wafers, detected in the respective MPCs, via a monitor in a wafer surface monitoring system.
Figure 3B:
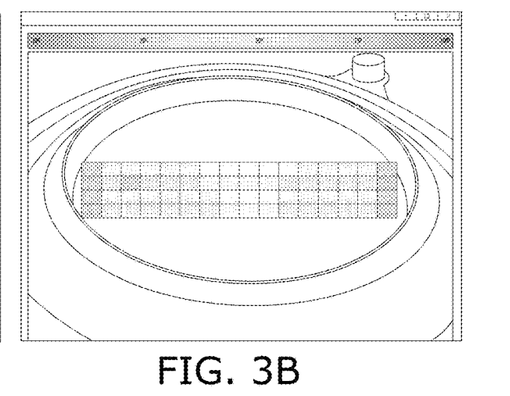
FIG. 3B shows the surface temperatures of each of the wafers, detected in the respective MPCs, in detail via the monitor in the wafer surface monitoring system.
Figure 3C:
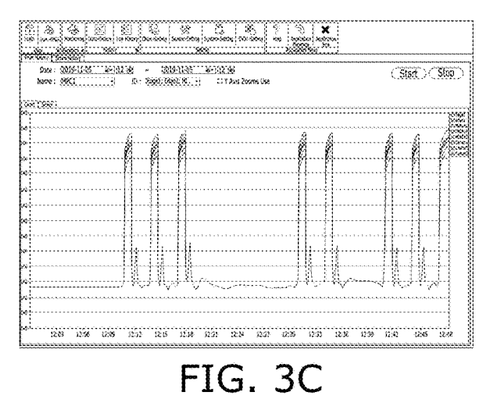
FIG. 3C is a graph showing variations in the surface temperatures of each of the wafers, detected in the respective MPCs, via the monitor in the wafer surface monitoring system.
Figure 3D:
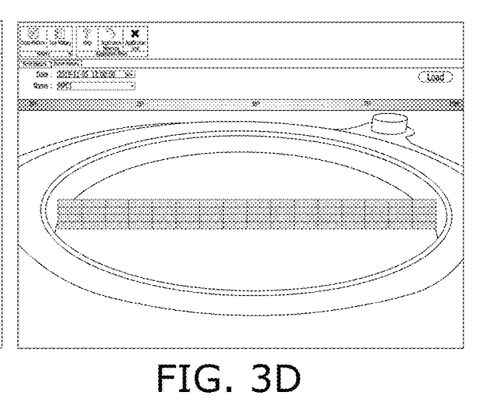
FIG. 3D shows recorded variations in the surface temperatures of each of the wafers, detected in the respective MPCs, via the monitor in the wafer surface monitoring system.

The wafer surface monitoring system 41 may display all the temperature data of the individual MPCs 2, may display temperature data for each of the MPCs, or may entirely or selectively display temperature data in the form of a history view or recording view. In other words, FIG. 3A shows all the surface temperatures of the wafers, detected in the respective MPCs, via a monitor in the wafer surface monitoring system 41, FIG. 3B shows the surface temperatures of each of the wafers, detected in the respective MPCs, in detail via the monitor in the wafer surface monitoring system 41, FIG. 3C is a graph showing variations in the surface temperatures of each of the wafers, detected in the respective MPCs, via the monitor in the wafer surface monitoring system 41, and FIG. 3D shows recorded variations in the surface temperatures of each of the wafers, detected in the respective MPCs, via the monitor in the wafer surface monitoring system 41.

Furthermore, when the controller 30 determines that the surface temperatures of a wafer detected in one of the MPCs 2 is equal to or higher than a set temperature, the wafer surface monitoring system 41 issues an alarm via the monitor 40, thereby allowing an administrator to perform post-processing on the corresponding chamber. Furthermore, the controller 30 transmits temperature data for the individual MPCs 2 to a fault detection and classification (FDC) unit 50 over a communication network. Additionally, the controller 30 stores not only the temperature data received from the MPCs 2 but also comparison, analysis and reporting information in a database (DB) 31.

The FDC unit 50 collects and analyzes the data of the wafer surface monitoring system in real time. Additionally, the FDC unit can deal with a problem occurring during wafer surface monitoring in time, can minimize the failures of the equipment by setting the PM of an appropriate period through the analysis of accumulated data, and can perform more precise analysis work by identifying correlations between different pieces of data and combining the identified correlations, thereby enabling the defect-free process of a semiconductor wafer cleaning apparatus.

A method of monitoring the surface temperatures of wafers in real time in a semiconductor wafer cleaning apparatus according to an embodiment of the present invention will be described in detail below with reference to the flowchart of FIG. 2.

As shown in FIG. 2, the step of cleaning up metal contaminants or organic contaminants on the surfaces of wafers while chemically reacting the surfaces of the wafers within the MPCs 2 of the semiconductor wafer cleaning apparatus 1 is performed at step S1. In this case, the non-contact temperature sensors 10, i.e., infrared cameras, installed within the respective MPCs 2, detect the surface temperatures of the wafers at step S2. Furthermore, the signals of the surface temperatures of the wafers detected by the temperature sensors 10 are amplified by a predetermined level by the amplifiers 20 and output to the controller 30 at step S3.

The controller 30 receives the signals of the respective amplifiers 20, divides the surface of a corresponding one of the wafers into a predetermined number of unit channels for each of the MPCs 2 by means of the wafer surface monitoring system 41 installed on the controller, and converts the signals into temperature data at step S4. Furthermore, the wafer surface monitoring system 41 performs simulation processing on the obtained temperature data and the data in a graphical user interface (GUI) graph via the monitor 40 at step S5. Furthermore, the controller 30 stores the obtained temperature data in the DB 31 at step S6. Furthermore, the wafer surface monitoring system 41 compares and analyzes the temperature data obtained in the controller and reports and prints the temperature data at step S7.

When the controller 30 determines that the surface temperatures of a wafer detected in a corresponding one of the MPCs 2 is equal to or higher than a set temperature, an administrator can be notified by issuing an alarm via the monitor 40, thereby allowing the administrator to perform post-processing at step S8. Furthermore, the controller 30 transmits temperature data for each of the MPCs 2 to the fault detection and classification (FDC) unit 50 over a communication network at step S9.

In other words, the wafer surface monitoring system 41 of the controller 30 may allow all the temperature data of the MPCs 2 to be displayed via the monitor 40, as shown in FIG. 3A, and may allow the temperature data of a corresponding chamber 2 to be displayed via the monitor 40, as shown in FIG. 3B. Furthermore, the wafer surface monitoring system 41 may allow a history view of temperature data generated in the MPC 2 to be displayed, and may allow a recording view of temperature data generated in the MPC 2 to be displayed, as shown in FIG. 3D.

Figure 4:
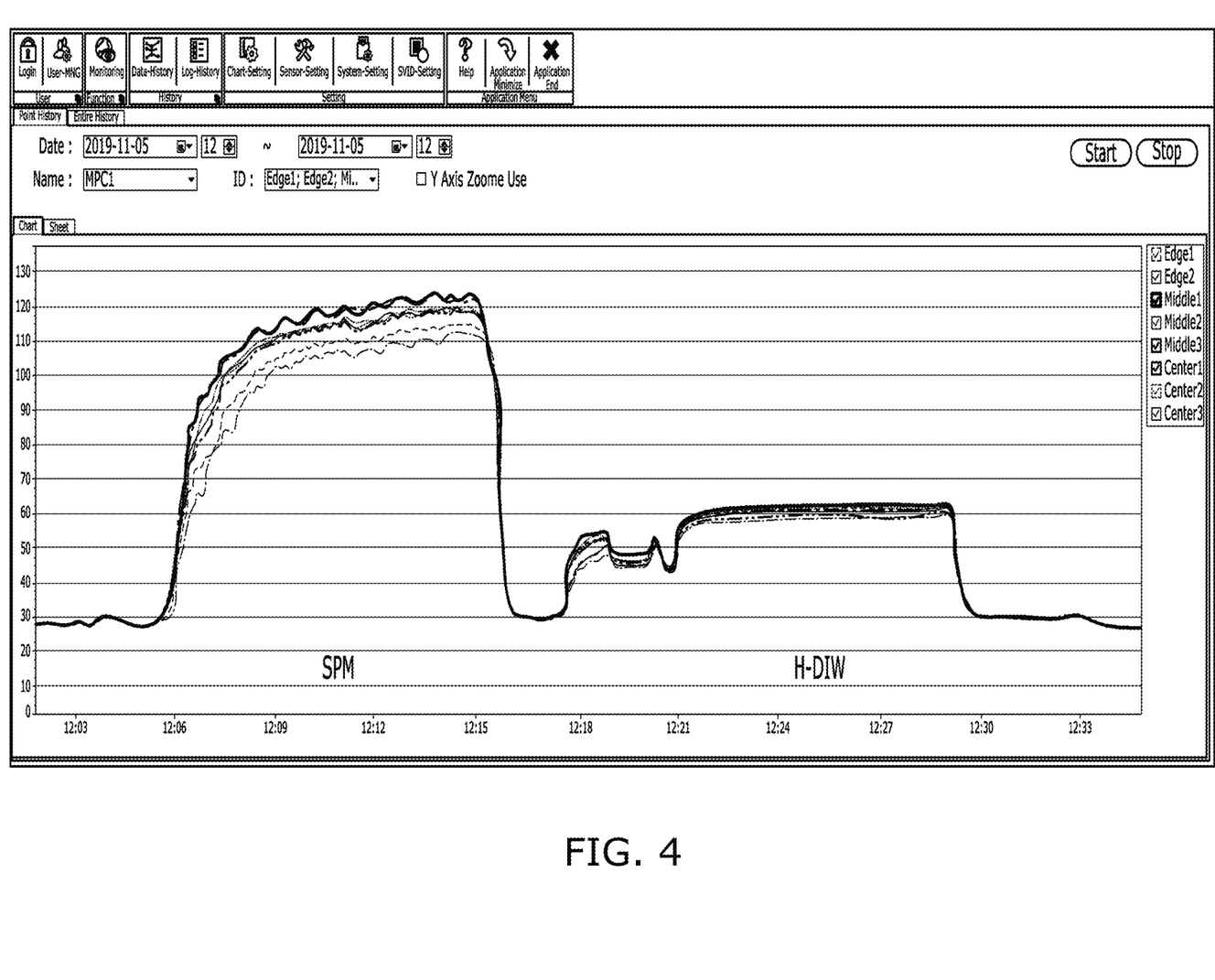
FIG. 4 is a graph showing the trend of variations in the surface temperatures of wafers detected in respective multi-station process chambers of a semiconductor wafer cleaning apparatus by the method for monitoring the surface temperatures of wafers in real time according to the present invention.

Furthermore, as shown in FIG. 4, the wafer surface monitoring system 41 of the controller 30 may graphically represent an overall trend in temperature data generated in the process of cleaning the wafers through the MPCs 2.

Meanwhile, according the present invention, during the process of mechanically planarizing metal or organic contaminants on a surface of a wafer by moving a platen and a polishing head relative to each other while chemically reacting the surface of the wafer by supplying slurry in the state in which a polishing pad has been brought into contact with the surface of the wafer, the surface temperatures of the polishing pad are detected by the temperature sensors, signals are amplified, the surface of the polishing pad is divided into a predetermined number of unit channels, the signals are converted into temperature data, simulation processing is performed on the obtained temperature data and displayed via the monitor in the form of a GUI graph in the wafer surface monitoring system, the temperature data obtained in the controller is stored in a database (DB), the temperature data is compared and analyzed, and the temperature data may be reported and printed.

Furthermore, although the present invention is described as monitoring the surface temperatures of wafers in real time in the process of cleaning semiconductor wafers, it may also monitor the surface temperatures of polishing pads in real time in the process of polishing semiconductor wafers.

Next, an embodiment of an infrared temperature sensor for measuring the surface temperatures of a wafer according to the present invention will be described in detail. The temperature sensor of the present invention is presented as an optimum embodiment which is intended to be used for the above-described method of monitoring the surface temperatures of wafers.

As shown in the drawing, the infrared temperature sensor for measuring the surface temperatures of a wafer according to the present invention is configured to be used in an environment where a fume generated from a cleaning solution is present, and is configured to maintain the incident angle of infrared rays at 90 degrees thus to be responsible for temperatures for the respective points of an infrared camera and enable temperature correction for each section.

In the following embodiments of the present invention, the term "one side" refers to the left side of each member and the term "the other side" refers to the right side thereof, unless otherwise stated.

Figure 7:
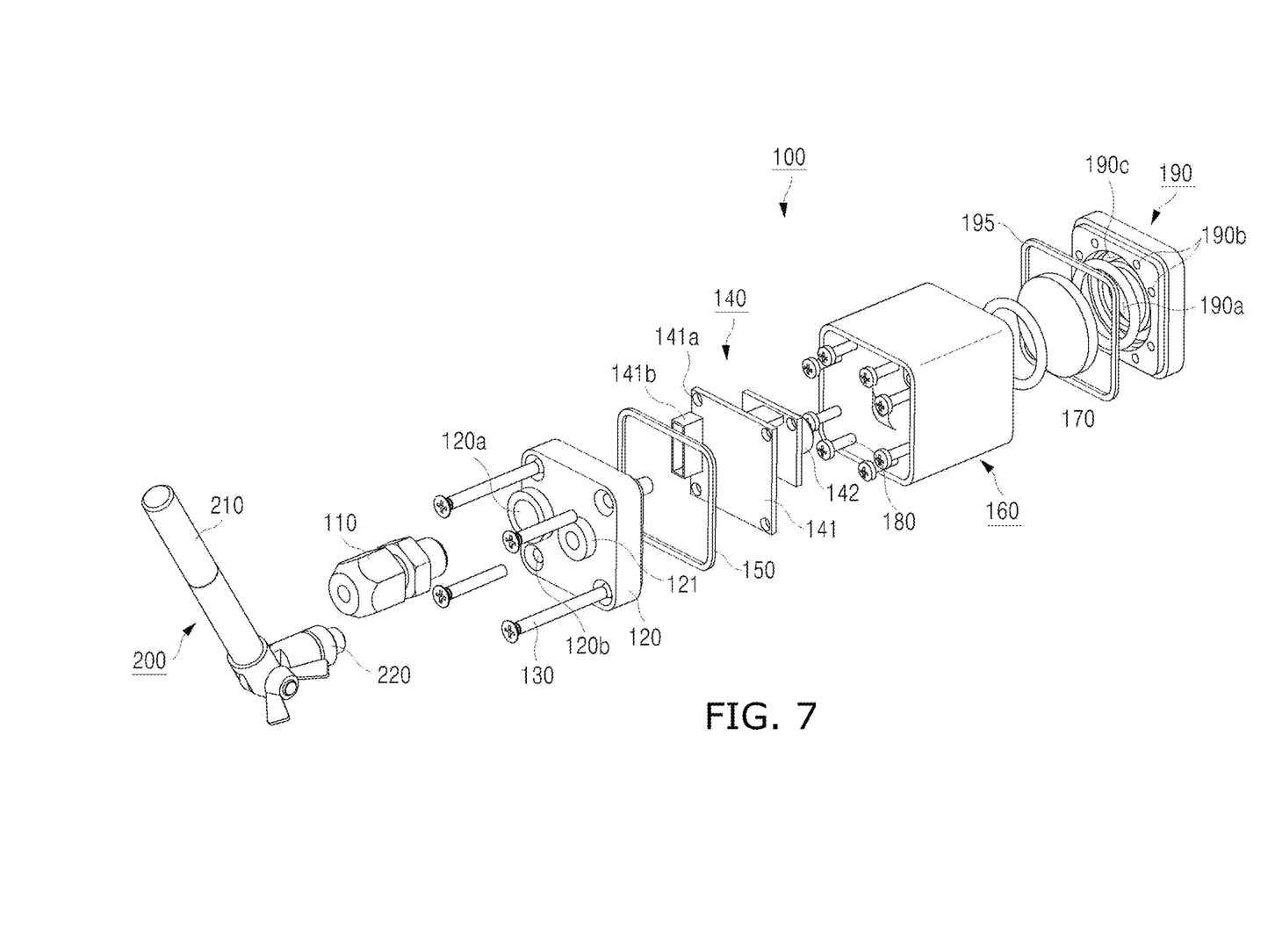
FIG. 7 is an exploded perspective view showing the infrared temperature sensor for measuring the surface temperatures of a wafer according to the present invention.
Figure 8:
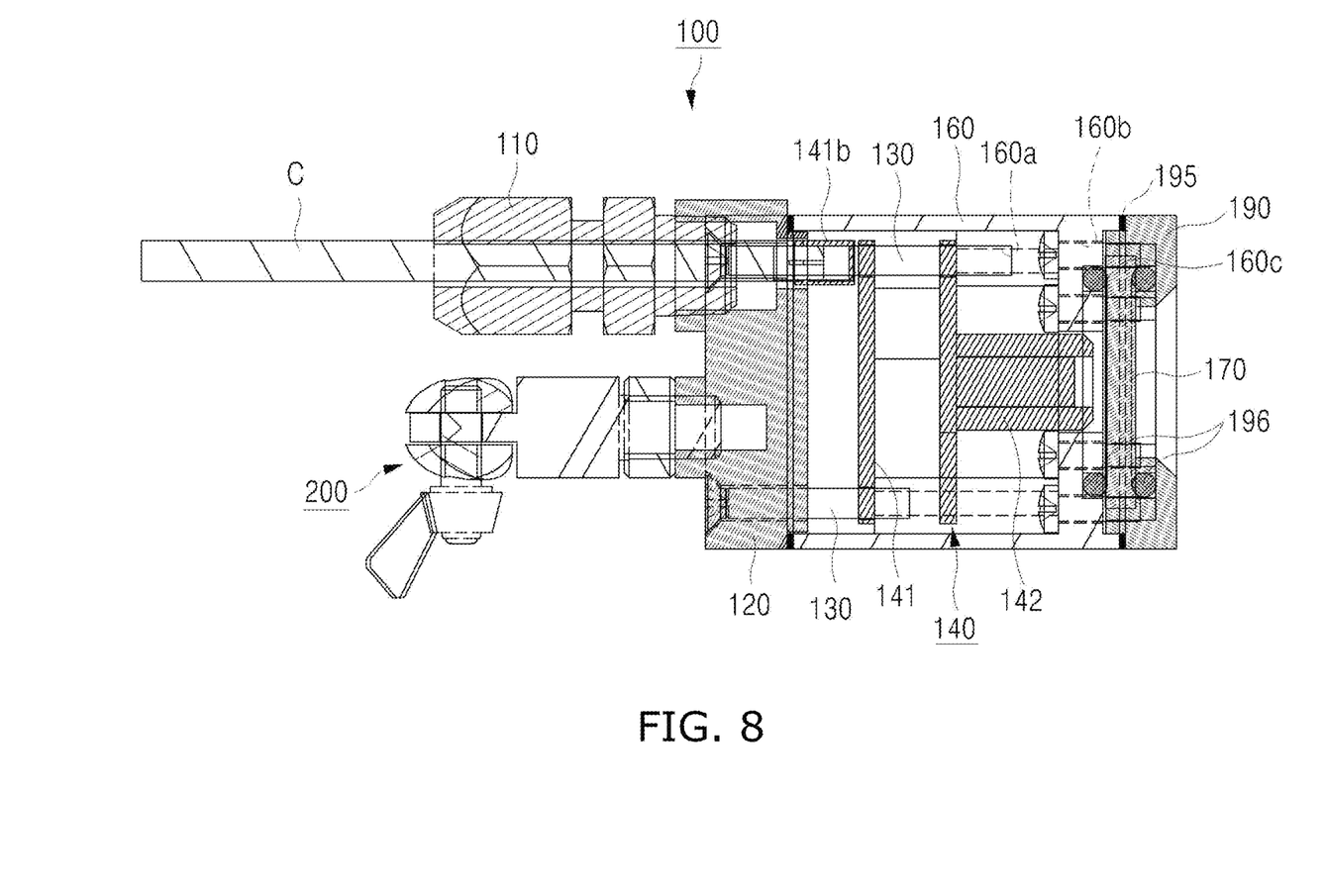
FIG. 8 is a side sectional view showing the infrared temperature sensor for measuring the surface temperatures of a wafer according to the present invention.

In other words, a sensor 10 for measuring the surface temperatures of a wafer according to the present invention includes: a back-end cover member 120 in one side of which a guide hole 120a is formed and provided to guide a cable C disposed to transmit and receive measured temperature information data to and from a controller (not shown) through a cable guide member 110 so that the sensor 10 can be installed inside each of the MPCs 2 of the semiconductor wafer cleaning apparatus 1 and measure the surface temperatures of a wafer 4; a temperature sensor part 140 which is fastened to the other surface of the back-end cover member 120 via a plurality of fastening screws 130, one surface of which is formed to be connectable to the cable C and the other surface of which is provided with an infrared camera 142, in which the infrared camera 142 is configured to detect temperatures for respective points of a wafer W, and which is coated with epoxy in order to prevent the entry of water; an intermediate cover member 160 which is provided such that one end thereof can be fastened via the plurality of fastening screws 130 in a waterproofing manner with an intermediate cover sealing member 150 interposed therebetween by accommodating the temperature sensor part 140 therein; a window member 170 which is located in front of the infrared camera 142 of the temperature sensor part 140 by being seated at the other end of the intermediate cover member 160 in a sealable manner and the surfaces of which are coated with diamond-like carbon (DLC) so that they have chemical resistance and abrasion resistance; and a front end cover member 190 which fastens the window member 170 with a part of the window member 170 exposed by being fastened to the other end of the intermediate cover member 160 by a plurality of screws 180, and which is provided to prevent the entry of water.

Figure 5:
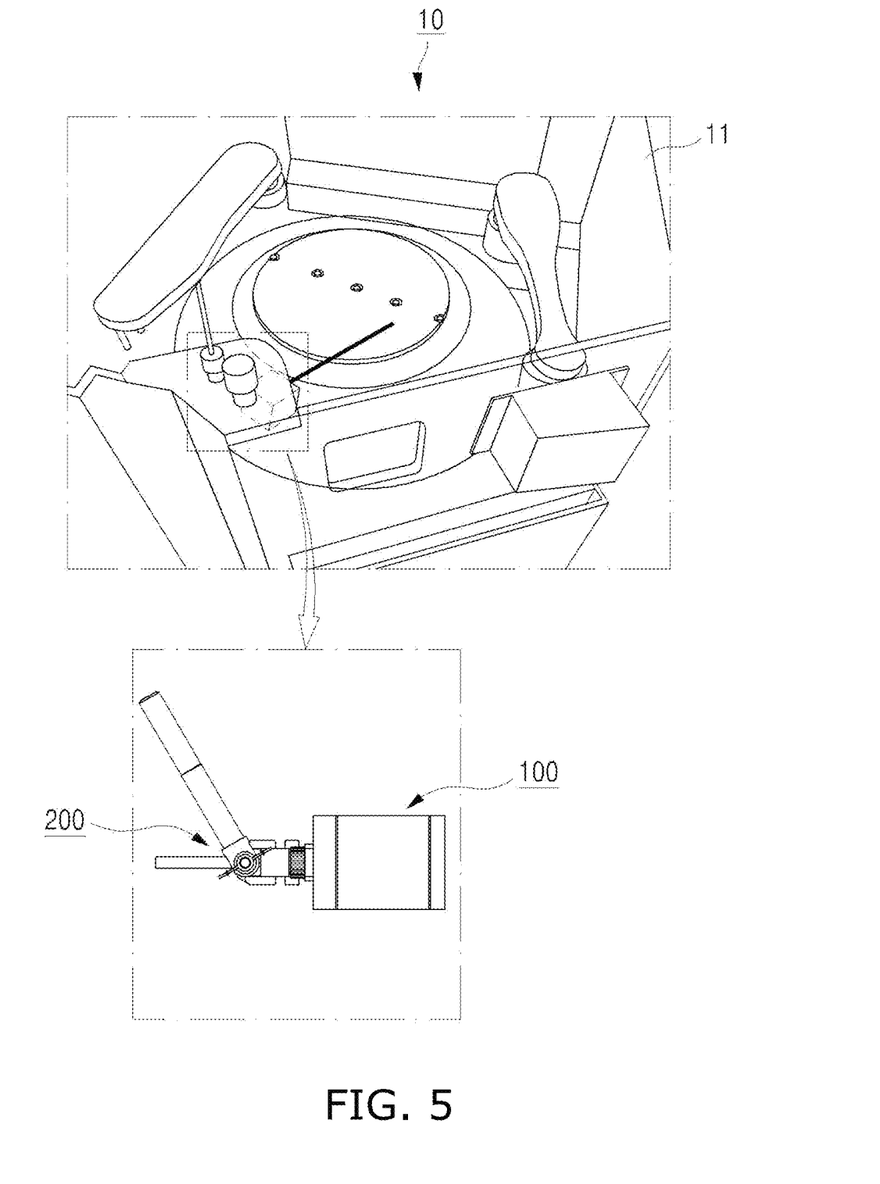
FIG. 5 is a view showing a state in which an infrared temperature sensor for measuring the surface temperatures of a wafer according to the present invention has been installed inside a chamber of a semiconductor wafer cleaning apparatus.
Figure 6:
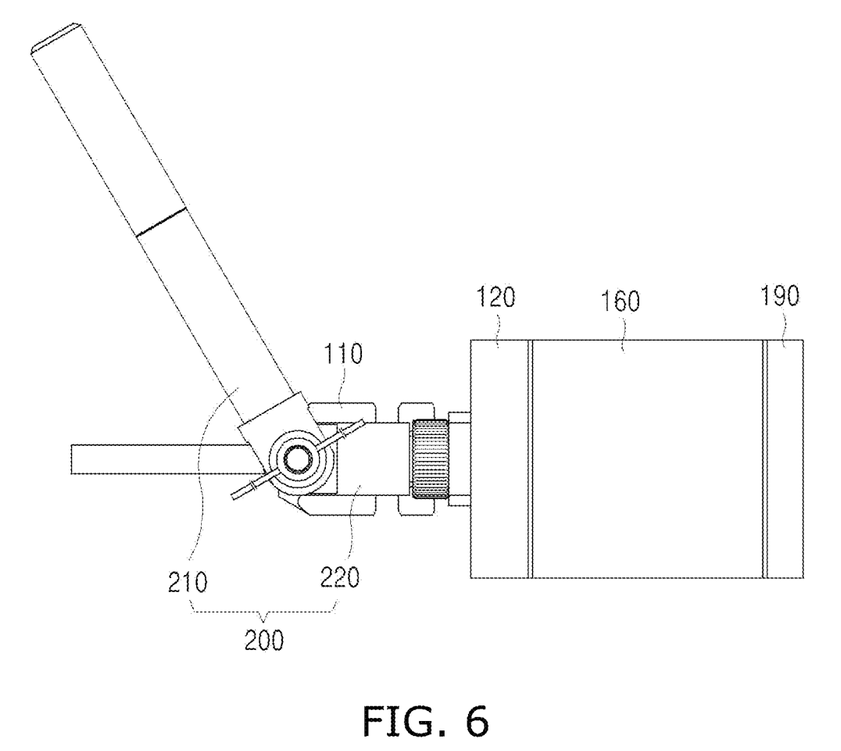
FIG. 6 is a side view showing the infrared temperature sensor for measuring the surface temperatures of a wafer according to the present invention.

In this case, the infrared temperature sensor for measuring the surface temperatures of a wafer is installed such that the angle thereof is adjustable by a fastening member 200 including a fastening bar 210 configured such that one end thereof is fastened to the inner surface of a corresponding MPC and a connecting bar 220 configured such that one end thereof is connected to the fastening bar 210 so that the angle thereof is adjustable.

The infrared temperature sensor for measuring the surface temperatures of a wafer 10 according to the present invention detects temperatures in multiple areas, and is configured to detect temperatures in 64 areas (64 CHs) into which the surface of a wafer 4 is divided. The infrared temperature sensor 10 has an operating range of about −30 to 120 degrees and a temperature measurement range of about −70 to 380 degrees. Furthermore, the infrared temperature sensor 10 has a measurement distance range of about 50 to 600 mm and a measurement angle range of about 40 to 60 degrees. The angle at which the infrared temperature sensor 10 is installed relative to the wafer 4, i.e., a monitoring target, ranges from about 60 to 120 degrees.

The back-end cover member 120 of the infrared temperature sensor for measuring the surface temperatures of a wafer 10 according to the present invention is provided such that one surface thereof is fastened to the fastening member 200, the temperature sensor part 140 is fastened by the other surface thereof, and it guides the cable C, connected to the temperature sensor part 140, through the cable guide member 110.

In other words, the back-end cover member 120 is provided such that a fastening protrusion 121 protrudes from one surface thereof in order to be fixedly connected to one end of the fastening member 200 the other end of which is fastened to the MPC and a guide hole 120a is formed on one side of the fastening protrusion 121 in order to fixedly install the cable guide member 110 provided to guide the cable C which is connected to the temperature sensor part 140.

Furthermore, fastening holes 120b are formed in respective corners of the back-end cover member 120 in order to fasten the temperature sensor part 140 via the plurality of fastening screws 130.

The temperature sensor part 140 is configured to be fastened to the other surface of the back-end cover member 120 via the plurality of fastening screws 130 and to detect the surface temperatures of the wafer W, and is provided to prevent the entry of water.

In other words, the temperature sensor part 140 includes: a PCB 141 in which PCB fastening holes 141a are formed in the corners thereof so that it can be fastened to the other surface of the back-end cover member 120 via the plurality of fastening screws 130, and one side of one surface of which a cable connection portion 141b is formed in order to connect the cable C; and the infrared camera 142 which is fixedly disposed and provided on the other surface of the PCB. Furthermore, the temperature sensor part 140 is coated with epoxy in order to prevent the entry of water.

The intermediate cover member 160 is provided such that the front and rear surfaces thereof are passed through by the plurality of fastening screws 130 to be fastened to the back-end cover member 120 by accommodating the temperature sensor part 140 therein with the intermediate cover sealing member 150 interposed therebetween in order to prevent the entry of water.

In other words, the intermediate cover member 160 is provided such that it is formed as a hollow tube so that it can be fastened to the back-end cover member 120 via the plurality of fastening screws 130 by accommodating the temperature sensor part 140 therein with the intermediate cover sealing member 150 interposed therebetween in a waterproofing manner, a fastening screw hole 160a is formed at a corner portion of the inner surface of the intermediate cover member 160, and a plurality of fastening holes 160b is formed in one side of the fastening screw hole 160a in a radial direction so that the intermediate cover member 160 can be fastened to one surface of the front end cover member 190 via the plurality of screws 180 with a front end cover sealing member 195 interposed therebetween.

Furthermore, a plurality of stepped portions 160c is formed and provided at the other end of the intermediate cover member 160 so that the window member 170 can be seated on the intermediate cover member 160 with O-rings 196 for sealing interposed therebetween.

The window member 170 is disposed between the intermediate cover member 160 and the front end cover member 190, and thus part of the window member 170 is exposed through the front end cover member 190. Accordingly, the surfaces of the window member 170 are coated with diamond-like carbon (DLC) in order to have chemical resistance and abrasion resistance.

In other words, the window member 170 is made of a glass material, the surfaces of the window member 170 are coated with DLC in order to have chemical resistance and abrasion resistance, and the window member 170 is disposed between the intermediate cover member 160 and the front end cover member 190 so that part of the window member 170 can be exposed through the front end cover member 190.

Furthermore, the O-rings 196 for sealing are provided on both sides of the window member 170 in order to prevent the leakage of water.

Figure 9:
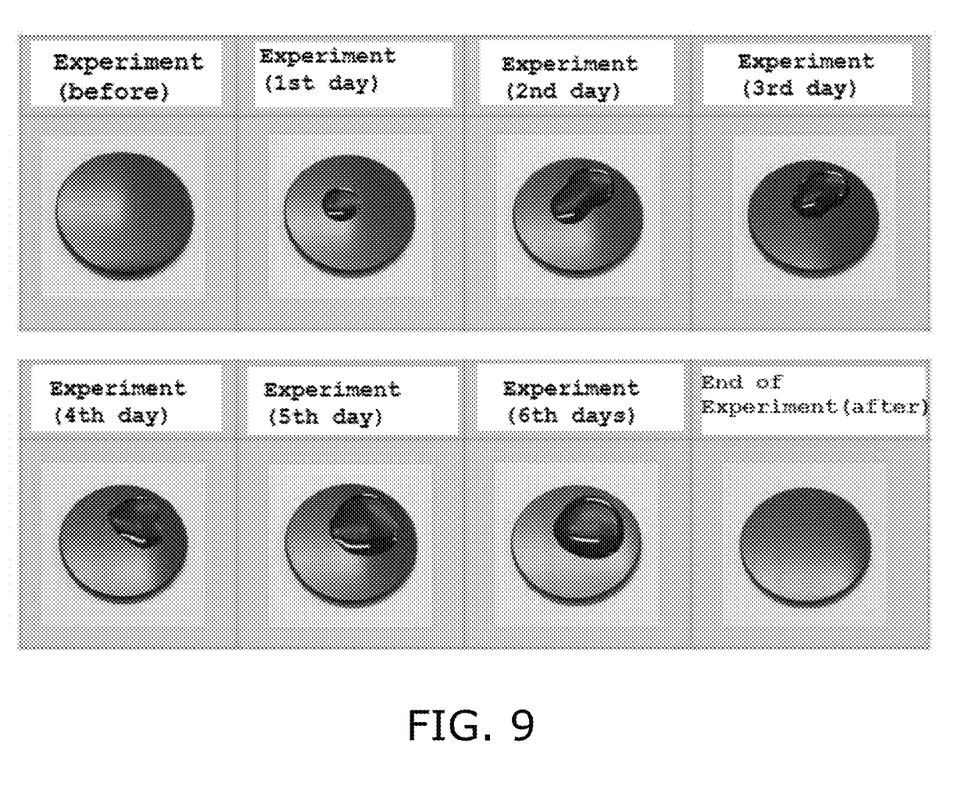
FIG. 9 is a view showing a process of experimenting on the window member of the infrared temperature sensor for measuring the surface temperatures of a wafer according to the present invention with sulfuric acid.
Figure 10:
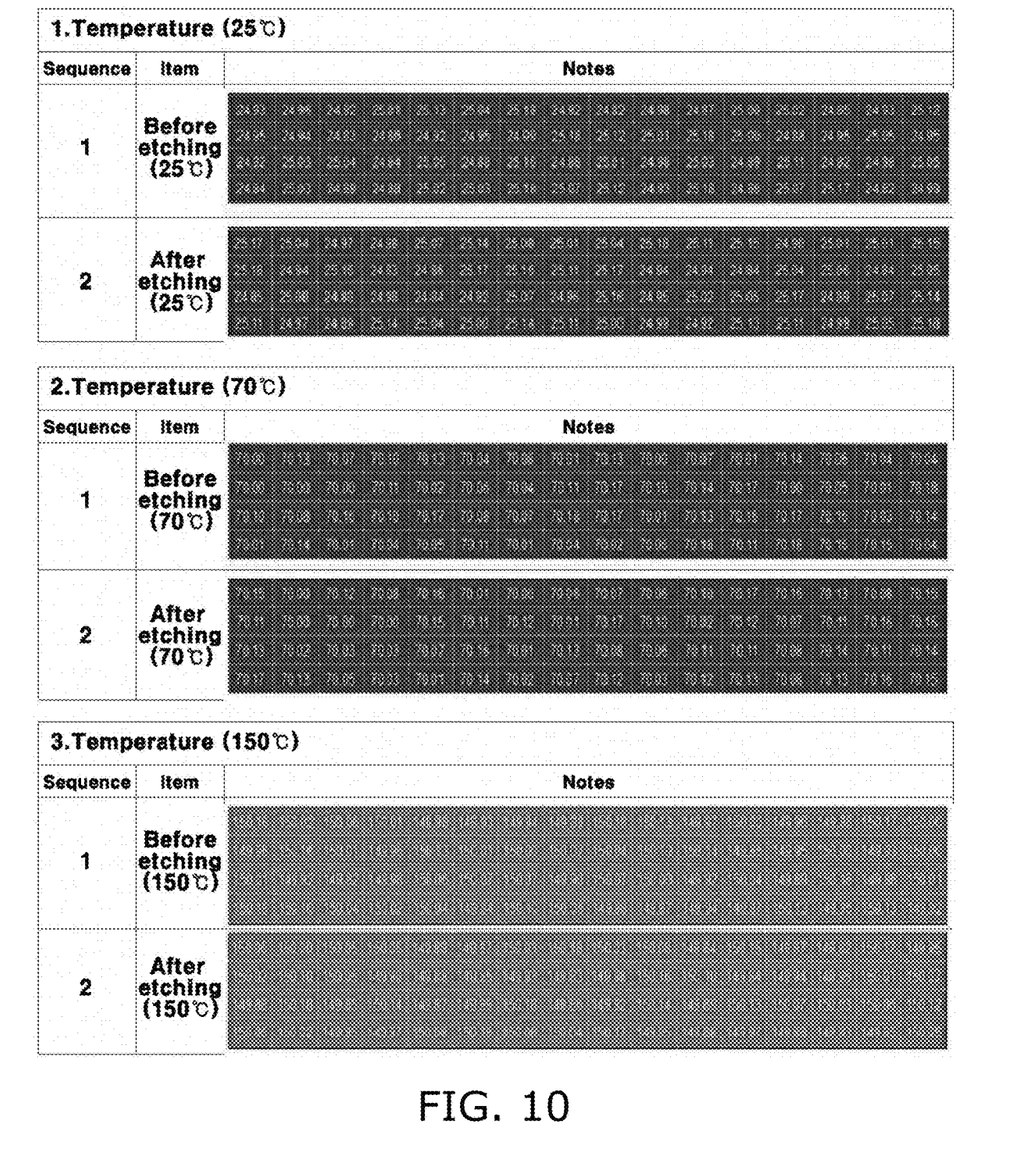
FIG. 10 is a view showing the results of the measurement of temperatures performed before and after experimenting on the window member of the infrared temperature sensor for measuring the surface temperatures of a wafer according to the present invention with sulfuric acid.

As a result of testing whether or not DLC (diamond-like carbon) became abnormal by dropping 0.5 cc of sulfuric acid (95% sulfuric acid) onto the surface of the window member, coated with DLC (diamond-like carbon), as described above, once a day for six days, as shown in FIG. 9, it could be seen that there was no abnormality. In addition, as a result of measuring the temperatures through the window member 170 before and after the experiment using sulfuric acid (95% sulfuric acid), as shown in FIG. 10, as shown in FIG, it could be seen that there was no change. In other words, the sensor was rarely directly exposed to strong acid, and thus it was exposed to strong acid for 6 days but showed no abnormality in internal corrosion. In addition, it could be seen that the accuracy of the temperature sensor was stable within the range of 0.2 degrees before and after exposure to sulfuric acid in 25, 70 and 150 degrees which are critical temperature sections. As such, the DLC (diamond-like carbon) coating does not interfere with temperature sensing, and thus accurately temperature detection can be achieved.

The front end cover member 190 is provided to fasten the window member 170 by being coupled to the other end of the intermediate cover member 160 in a waterproofing manner so that part of the window member 170 can be exposed.

In other words, the front end cover member 190 is provided such that an exposure hole 190a is formed in the center thereof such that part of the front end cover member 190 is exposed to the outside while fastening the window member 170 seated at the other end of the intermediate cover member 160 in a waterproofing manner and a plurality of fastening screw holes 190b is provided in the front portion of one surface of the front end cover member 190 in a radial direction so that the front end cover member 190 can be fastened via the plurality of screws 180 with the front end cover sealing member 195 interposed therebetween.

Furthermore, O-ring grooves 190c are further formed and provided between the fastening screw hole 190b and the exposure hole 190a in order to receive the O-rings 196 for sealing which is provided to prevent the entry of water.

The infrared temperature sensor for measuring the surface temperatures of a wafer according to the present invention, which is configured as described above, is fixedly installed on the inside of the MPC of the semiconductor wafer cleaning apparatus. When it is necessary to detect the surface temperatures of a wafer, the fastening protrusion 121 formed on the back-end cover member 120 of the infrared temperature sensor for measuring the surface temperatures of a wafer 10 is fastened to the connecting bar 220 of the fastening member 200 one end of which is fastened to the inner surface of the MPC via the fastening bar 210, as shown in FIGS. 5 to 9.

Once the back-end cover member 120 has been fastened as described above, the cable C is connected to the controller.

Thereafter, an angle is adjusted through the fastening member 200 so that the infrared temperature sensor for measuring the surface temperatures of a wafer 10 can detect the surface of the wafer 4 in real time.

The angle is adjusted as described above, and thus the surface temperatures of the wafer based on the supply of the wafer is detected by the infrared camera 142 of the temperature sensor part 140 and transmitted to the controller through the cable C.

When the infrared temperature sensor has been used for a long period of time after being installed in the MPC, fume generated by the supply of a cleaning solution for the purpose of cleaning the wafer is condensed on the surface of the window member 170.

In this case, the infrared temperature sensor may be reused by cleaning it through the spraying of cleaning water DI WATER thereonto.

In other words, the infrared temperature sensor for measuring the surface temperatures of a wafer 10 is configured such that the cover member is fastened with a sealing member interposed and the temperature sensor part 140 is coated with epoxy, and thus the infrared temperature sensor may be reused by cleaning it through the spraying of cleaning water DI WATER thereonto, thereby reducing defects in the detection of the surface temperatures of a wafer.

According to the present invention, the surface temperatures of wafers can be wirelessly detected by the temperature sensors in real time in the process of cleaning the wafers with a semiconductor wafer cleaning apparatus, the surface temperatures of a wafer detected by each of the temperature sensors can be separated into a plurality of channels and visually displayed via the monitor, a plurality of chambers installed in a semiconductor wafer cleaning apparatus can be monitored in an integrated manner, the surface temperatures of polishing pads can be accurately detected by the temperature sensors in the process of polishing wafers, and the excessively heating of the surface of a wafer or polishing pad to a predetermined temperature or higher attributable to chemical reaction and friction can be detected in real time in the process of removing metal and organic contaminants from the surface of the semiconductor wafer, thereby reducing the defect rate of wafers and this improving the yield rate of wafers.

The infrared temperature sensor for measuring the surface temperatures of a wafer according to the present invention provides effects in that the infrared temperature sensor can be used in an environment in which there is fume generated from a cleaning solution and in that the incident angle of infrared rays can be maintained at 90 degrees, and thus the infrared temperature sensor can be responsible for temperatures at respective points of the infrared camera and allows the correction of temperatures in respective sections because.

The above description is merely illustrative of the technical spirit of the present invention, and those having ordinary skill in the art to which the present invention pertains may make various modifications and alterations without departing from the essential features of the present invention. Therefore, the embodiments disclosed herein are not intended to limit the technical spirit of the present invention but to describe the present invention. The scope of the technical spirit of the present invention is not limited by these embodiments. The scope of the present invention should be interpreted based on the following claims, and all technical spirits falling within a range equivalent to the following claims should be interpreted as being included in the scope of the present invention.

What is claimed is:

1. A method of monitoring surface temperatures of wafers in real time in a semiconductor wafer cleaning apparatus, the method comprising:
    (a) cleaning surfaces of wafers inside multi-station processing chambers (MPCs) of a semiconductor wafer cleaning apparatus;
    (b) detecting, by temperature sensors installed in the respective MPCs, surface temperatures of the wafers;
    (c) amplifying, by amplifiers, signals of the surface temperatures of the wafers detected by the temperature sensors into a predetermined level, and outputting, by the amplifiers, the amplified signals;
    (d) receiving, by a controller, the signals of the respective amplifiers, dividing, by a wafer surface monitoring system installed on the controller in an application form, a surface of a corresponding one of the wafers into a plurality of channels for each of the MPCs, and converting, by the wafer surface monitoring system, the signals into temperature data;
    (e) performing, by the wafer surface monitoring system, simulation processing on the obtained temperature data, displaying, by the wafer surface monitoring system, the obtained temperature data in a graphical user interface (GUI) graph via the monitor, classifying, by the wafer surface monitoring system, the obtained temperature data for all MPCs, each of the MPCs, each history view, or each recording view, and entirely or selectively displaying, by the wafer surface monitoring system, the obtained temperature data;
    (f) storing, by the wafer surface monitoring system, the temperature data obtained in the controller, comparing and analyzing, by the wafer surface monitoring system, the temperature data, and reporting and printing, by the wafer surface monitoring system, the temperature data;
    (g) issuing, by the controller, an alarm via the monitor when determining that a surface temperature of a wafer detected in one of the MPCs is equal to or higher than a set temperature; and
    (h) transmitting, by the controller, temperature data for the individual MPCs to a fault detection and classification (FDC) unit over a communication network.

2. An infrared temperature sensor for measuring surface temperatures of a wafer, the infrared temperature sensor comprising:
    a back-end cover member in one side of which a guide hole is formed and provided to guide a cable disposed to transmit and receive measured temperature information data to and from a controller through a cable guide member so that the infrared temperature sensor can be installed inside each of the MPCs of a semiconductor wafer cleaning apparatus and measure surface temperatures of a wafer;
    a temperature sensor part which is fastened to a remaining surface of the back-end cover member, one surface of which is formed to be connectable to the cable and a remaining surface of which is provided with an infrared camera, and in which the infrared camera is configured to detect temperatures for respective points of the wafer;
    an intermediate cover member which is provided such that one end thereof can be fastened in a waterproofing manner with an intermediate cover sealing member interposed therebetween by accommodating the temperature sensor part therein;
    a window member which is located in front of the infrared camera of the temperature sensor part by being seated at a remaining end of the intermediate cover member in a sealable manner and surfaces of which are coated with diamond-like carbon (DLC) so that they have chemical resistance and abrasion resistance; and
    a front end cover member which fastens the window member with a part of the window member exposed by being fastened to a remaining end of the intermediate cover member, and which is provided to prevent an entry of water;
    wherein the back-end cover member is provided such that a fastening protrusion protrudes from one surface thereof in order to be fixedly connected to one end of a fastening member a remaining end of which is fastened to a multi-station processing chamber (MPC), a guide hole is formed in one side of the fastening protrusion in order to fixedly install the cable guide member provided to guide the cable which is connected to the temperature sensor part, and fastening holes are formed in respective corners of the back-end cover member in order to fasten the temperature sensor part via a plurality of fastening screws; and
    wherein the fastening member comprises a fastening bar configured such that one end thereof is fastened to an inner surface of the MPC and a connecting bar configured such that one end thereof is connected to the fastening bar so that an angle thereof is adjustable.

3. The infrared temperature sensor of claim 2, wherein the temperature sensor part comprises:
    a PCB in corners of which PCB fastening holes are formed such that the PCB can be fastened to a remaining surface of the back-end cover member via the plurality of fastening screws, and one side of one surface of which a cable connection portion is formed in order to connect the cable; and
    the infrared camera which is fixedly disposed and provided on a remaining surface of the PCB;
    wherein the temperature sensor part is coated with epoxy in order to prevent an entry of water.

4. The infrared temperature sensor of claim 2, wherein the intermediate cover member is provided such that it is formed as a hollow tube so that it can be fastened to the back-end cover member via the plurality of fastening screws by accommodating the temperature sensor part therein with the intermediate cover sealing member interposed therebetween in a waterproofing manner, a fastening screw hole is formed at a corner portion of an inner surface of the intermediate cover member, a plurality of fastening holes is formed in one side of the fastening screw hole in a radial direction so that the intermediate cover member can be fastened to one surface of the front end cover member via the plurality of screws with a front end cover sealing member interposed therebetween, and a plurality of stepped portions is formed and provided at a remaining end of the intermediate cover member so that the window member can be seated on the intermediate cover member with O-rings for sealing interposed therebetween.

\* \* \* \* \*